United States Patent
Chen et al.

(10) Patent No.: US 6,259,645 B1
(45) Date of Patent: Jul. 10, 2001

(54) MATCHING LOADING BETWEEN SENSING REFERENCE AND MEMORY CELL WITH REDUCED TRANSISTOR COUNT IN A DUAL-BANK FLASH MEMORY

(75) Inventors: Tien-Min Chen, San Jose; Ming-Huei Shieh, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/557,728

(22) Filed: Apr. 26, 2000

Related U.S. Application Data

(60) Provisional application No. 60/181,636, filed on Feb. 10, 2000.

(51) Int. Cl.[7] ........................................ G11C 7/02
(52) U.S. Cl. ................ 365/210; 365/185.2; 365/185.21; 365/230.03
(58) Field of Search ................ 365/210, 230.03, 365/185.2, 185.21, 205

(56) References Cited

U.S. PATENT DOCUMENTS

| | | | |
|---|---|---|---|
| 5,850,366 | * 12/1998 | Coleman, Jr. ........................ 365/210 |
| 5,901,086 | * 5/1999 | Wang et al. ...................... 365/185.21 |
| 6,038,169 | * 3/2000 | Ogura et al. .................. 365/185.2 X |
| 6,052,308 | * 4/2000 | Pitts ................................ 365/185.21 |
| 6,078,518 | * 6/2000 | Chevallier ..................... 365/185.2 X |
| 6,128,227 | * 10/2000 | Kim ................................ 365/185.21 |

* cited by examiner

*Primary Examiner*—Huan Hoang
(74) *Attorney, Agent, or Firm*—Brinks Hofer Gilson & Lione

(57) ABSTRACT

A memory integrated circuit (100) includes a first bank (102) of memory cells and a second bank (104) of memory cells. A sensing circuit (114) is coupled to the first and second banks of memory cells to determine a data state of a selected memory cell in relation to a reference cell (118). A loading circuit (206) is coupled with a sensing circuit and associated with the reference cell to approximate loading associated with the selected memory cell. The loading circuit is shared for sensing memory cells of the first bank and memories of the second bank. By sharing the loading circuit, total device count and manufacturing costs where the memory integrated circuit are reduced.

14 Claims, 2 Drawing Sheets

MATCHING LOADING BETWEEN SENSING REFERENCE AND MEMORY CELL WITH REDUCED TRANSISTOR COUNT IN A DUAL-BANK FLASH MEMORY

CROSS REFERENCE TO RELATED APPLICATIONS

This application claims priority of provisional application Ser. No. 60/181,636, filed Feb. 10, 2000 in the names of Tien-Min Chen and Ming-Huei Shieh.

BACKGROUND OF THE INVENTION

The present invention relates generally to a memory integrated circuit. More particularly, the present invention relates to a method and apparatus for matching the loading on a sensing reference circuit and a selected memory cell in a dual bank flash memory integrated circuit.

Memory circuits such as flash memory circuits conventionally include an array of memory cells, address decoding circuits for selecting one or more memory cells in the array, and a sensing circuit for sensing the data state of the selected memory cell. The sensing circuit compares a sensed signal, such as a voltage or current, from the selected memory cell with an analogous signal from a reference cell. Based on this comparison, the sensing circuit determines if the selected memory cell stores a logic 1 or a logic 0. The proper data is then provided to an output buffer for communication off-chip.

The sensing circuit must be very sensitive to detect the sensed signal. The node conveying sensed signal coming from a memory cell to the sensing circuit may travel the length of the integrated circuit. This node is referred to as a data line. The data line may include sources or drains of a large number of transistors, for example, in the address decoding circuit. The length of the data line and the other components connected to the data line introduce a large amount of capacitance and resistance on the data line. This introduces a non-zero RC time constant which slows the sensing of the signal on the data line.

To optimize the performance of the sensing circuit, it is known to balance the load on the sensed signal and the reference signal. The reference circuit may be positioned anywhere on the integrated circuit, either close to the sensing circuit or far away. The sensing circuit's performance is improved when the RC time constant of the reference circuit matches the RC time constant of the data line. This has been done, for example, by putting dummy metal lines on the chip to simulate capacitance on the bit line or data line being sensed. Also, transistors matching those on the data line have been electrically coupled to the reference line to further match the capacitive load. This technique has produced good results.

A new type of memory integrated circuit includes two independent banks of memory cells. In this architecture, a user can write a memory cell in a first bank while simultaneously reading a memory cell in the second bank. The enhances the flexibility of the memory chip for the user.

However, if two banks are not of the same size, separate matching circuits become necessary for the first bank and the second bank of memory cells. The RC load seen on bit lines and data lines in the two banks is largely dependent on the physical size of the bank and the number of transistors coupled to the bit lines and the data lines. To match the loading for each bank at the reference circuit, two loading circuits are necessary, one for each bank.

However, duplicating circuits is contrary to some of the basic design goals of integrated circuit design. These include minimizing the number of devices on the chip and minimizing chip size. Minimizing chip size is important because the manufacturing cost of the integrated circuit is directly related to the size of the chip. Minimizing the number of devices on the chip is important because each device increases the size of the chip, each device is a possible source of failure of the chip, and each device, when active, adds to the overall current drain of the chip. Minimizing current drain to produce a low power design is another basic design goal of integrated circuit design.

Accordingly, there is a need for a method and apparatus which permit accurate matching of the loading on a reference memory cell of a dual bank memory chip.

BRIEF SUMMARY OF THE INVENTION

By way of introduction only, a dual bank memory integrated circuit in accordance with the embodiments illustrated herein includes a single loading circuit. When a first bank of the dual bank chip is accessed, first loading circuitry is coupled to a reference core cell. A sensing circuit compares the signal from the selected memory cell with a signal from the reference core cell. When a second bank of the dual bank chip is accessed, second loading circuitry is also coupled to the reference core cell, along with the first loading circuitry. Thus, the first loading circuitry is used for balancing during an access of either the first bank or the second bank. The second loading circuitry is added only during an access of the second bank. This allows the devices required for load matching to be re-used, reducing the chip area required for the loading circuit and reducing the current drain of the overall integrated circuit.

The foregoing discussion of the preferred embodiments has been provided only by way of introduction. Nothing in this section should be taken as a limitation of the following claims, which define the scope of the invention.

DETAILED DESCRIPTION OF THE PRESENTLY PREFERRED EMBODIMENTS

This patent application is related to U.S. patent application Ser. No. 09/421,775, titled "Reference Cell Bitline Path Architecture For A Simultaneous Operation Flash Memory Device," filed on Oct. 19, 1999 , and assigned to Advanced Micro Devices, Inc. and Fujitsu, Ltd., which application is incorporated herein by reference.

Figure 1:
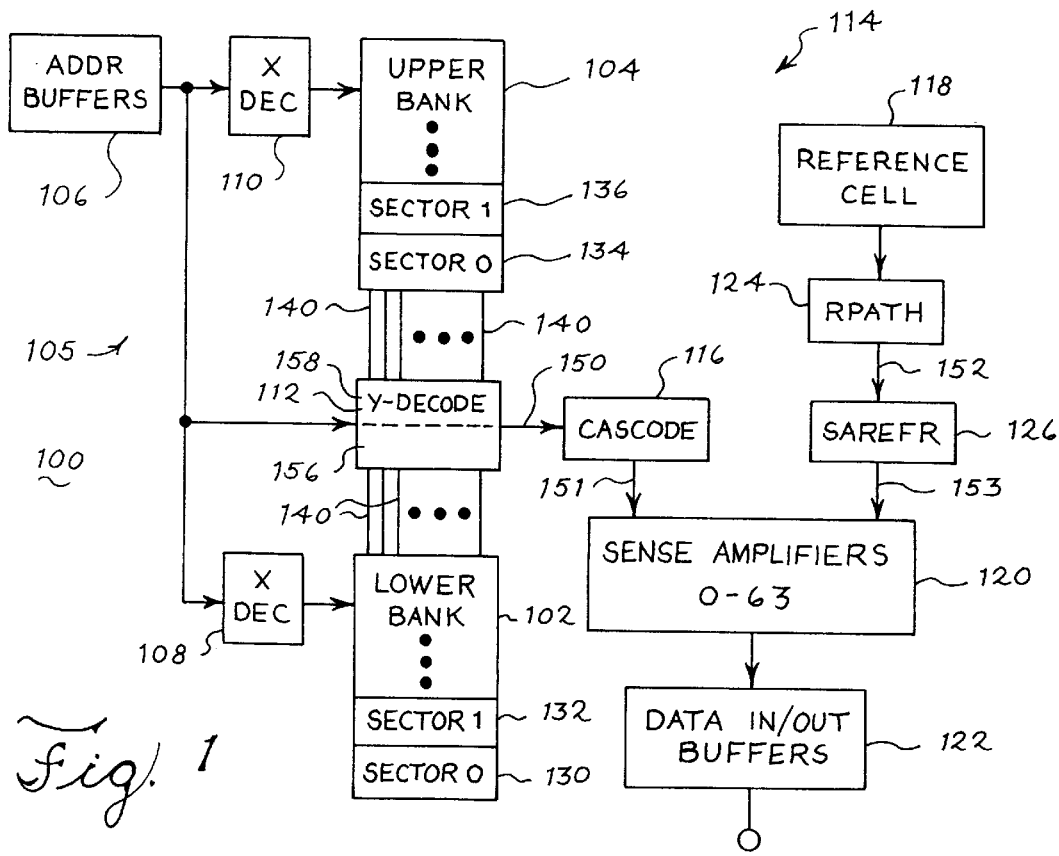
FIG. 1 is a block diagram of a dual bank memory integrated circuit.

Referring now to the drawing, FIG. 1 is a block diagram of a dual bank memory integrated circuit 100. The memory integrated circuit 100 includes a lower or first bank 102 of memory cells, an upper or second bank 104 of memory cells, address decoding circuitry 105, and sensing circuitry 114. The address decoding circuitry 105 includes address input buffers 106 which receive address signals from external to the integrated circuit 100, an X decode circuit 108 associated with the lower bank 102 of memory cells and an X decode circuit 110 associated with the upper bank 104 of memory cells. The address circuit 105 further includes a Y decode circuit 112. The sensing circuit 114 includes a cascode circuit 116, a reference cell 118, sense amplifiers 120 and data input/output buffers 122. The sensing circuit 114 further includes a reference path circuit 124 labelled rpath in FIG. 1 and a reference cascode circuit 126 labelled sarefr in FIG. 1.

The memory integrated circuit 100 is configured as a dual bank memory. Through assertion of proper control signals, one or more memory cells in either the lower bank 102 or the upper bank 104 may be written with data while one or more memory cells in the other of the lower bank 102 and the upper bank 104 is read.

The lower bank 102 and the upper bank 104 each contain a plurality of memory cells configured as an ordered array of rows and columns. The memory cells in each of the banks 102, 104 are disposed in a plurality of rows along a plurality of word lines which are selectively addressed by the X decode circuits 108, 110. The lower bank 102 and the upper bank 104 are further organized as a plurality of columns of memory cells. Each memory cell in a column is disposed along a bit line 140. The Y decode circuit 112 selects one or more bit lines for coupling to the cascode circuit 116 of the sensing circuit 114. In the illustrated embodiment, the Y decode circuit 112 includes a lower bank Y decode circuit 156 and an upper bank Y decode circuit 158. Each memory cell is positioned at the intersection of a word line and a bit line 140.

The banks 102, 104 may be further divided into sectors. For example, in the embodiment of FIG. 1, the lower bank 102 includes a first sector 130, a second sector 132 and so on. Similarly, the upper bank 104 includes a first sector 134, a second sector 136 and so on. The sectors 130, 132, 134, 136 may be separately selected by asserting sector select signals, which are generated using addressing signals applied to the memory integrated circuit 100. Sector select transistors respond to the sector select signals to place the sector in a selected or active state. The size of the sectors is predetermined but may be different for the different sectors 130, 132, 134, 136. For example, the sector 132, 134, 146 may be conventional sectors 64 Kbytes in size. Other sectors may be small sectors, which are smaller than the conventional sectors. The small sectors are 8 Kbytes in size.

The sensing circuit is coupled to the first and second banks 102, 104 of memory cells to determine a data state of a selective memory cell in relation to a reference cell 118. The cascode circuit 116 is an amplifier which receives a signal such as a voltage or current from the Y decode circuit 112. The cascode circuit 116 provides an output signal to the sense amplifiers 120 on a data line 150. The sense amplifiers 120 determine the state of the selected memory cell by comparing the signal on the data line 150 with a reference signal on the data bar line 152. The reference signal is generated using the reference cell 118, the reference path 124 and the reference cascode 126. The sense amplifiers determine the data state of the selected memory cell or memory cells and provide suitable data to the data input/output buffers 122. The data input/output buffers 122 provide the read data from the selected memory cell to circuitry external to the memory integrated circuit 100.

In the illustrated embodiment, the memory integrated circuitry 100 provides for page mode operation. In page mode, four words on a commonly addressed page are read from the banks 102, 104 simultaneously. Each word is then subsequently provided, one word at a time, through the data input/output buffers 122 to external circuitry. Thus, a total of 64 bits is initially read from the banks 102, 104 of memory cells. Subsequently, four 16-bit words are sequentially read out from the memory integrated circuit 100. Page mode operation improves performance and reduces overall average access time for reading data from the memory integrated circuit 100.

Thus, for reading data from the memory integrated circuit 100, an address signal is provided to the address buffers 106. Further internal address signals, including true and complement versions of the input address signal are provided to the X decode circuits 108, 110. If the banks 104, 106 are divided into sectors, sector select signals are generated to activate only the selected sector.

Similarly, internal address signals are provided to the Y decode circuit 112. If the selected address is in the lower bank, the X decode circuit 108 will select one row in the lower bank 102 for reading. Similarly, if the upper bank 104 is selected, the X decode circuit 110 will select one row of the upper bank 104. In the same manner the Y decode circuit 112 will select one column and one bit line 140 of the selected bank 102, 104. The Y decoder includes a plurality of pass transistors or pass gates which, in response to the Y decode signal, couple the selected bit line 140 to the data line 150.

The cascode circuit 116, acting as an amplifier, compares the signal on the data line 150 and the signal on the data bar line 152. The signal on the data bar line 152 is generated by the reference cell 118. The reference cell 118 includes one or more memory cells substantially identical to the memory cells which form the lower bank 102 and upper bank 104 of memory cells. The reference cell 118 produces a signal which forms a pre-determined threshold for the cascode 116. By comparing the signal on the data line 150 with the predetermined threshold on the data bar line 152, the cascode circuit 116 can determine the data state of the selected memory cell. This data state is provided to the sense amplifiers 120 and from there to the data input/output buffers 122.

It is to be noted that the block diagram of FIG. 1 is substantially simplified to illustrate operation of the memory integrated circuit 100. The memory integrated circuit 100 typically includes other circuitry to permit writing of data in one or more memory cells, and for controlling the overall state of the memory integrated circuit. In the preferred embodiment, the memory integrated circuit 100 is embodied as a flash memory employing CMOS flash technology. The integrated circuit 100 is thus a non-volatile memory which retains its data state even when operating power is removed from the integrated circuit 100.

Figure 2:
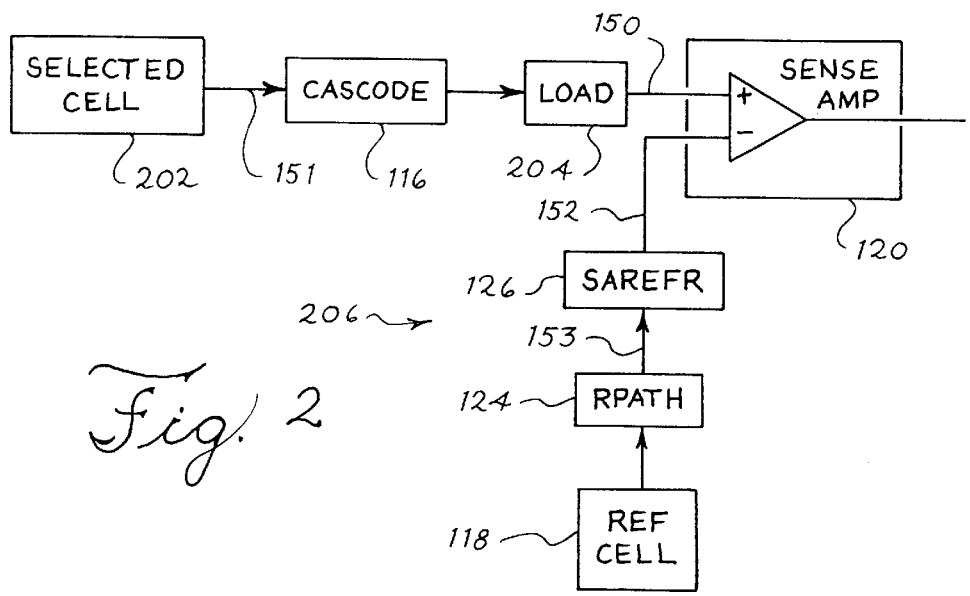
FIG. 2 is a block diagram of sensing circuitry of the dual bank memory integrated circuit of FIG. 1.

FIG. 2 is a block diagram of sensing circuitry 114 of the dual bank memory integrated circuit 100 of FIG. 1. The sensing circuitry 114 is redrawn to illustrate parasitic loading experienced by the data line 150 and the data bar line 152. From the perspective of the sensing circuit 114, the banks 102, 104 of memory cells and their associated address decoding circuitry 105 may be represented as a selected core cell 202. In response to the selection function of the addressing circuitry 105, one or more core cells or memory cells is selected, placing a data signal on the data line 150.

Associated with the data line 150 is parasitic loading 204. This parasitic loading 204 represents resistance and capacitance associated with the bit lines 140 and data line 150 of the memory integrated circuit 100. The resistance and capacitance are associated in part with the metal of the bit line 140 and the data line 150 which may run nearly the entire length or width of the integrated circuit 100. In addition, the bit line 140 and the data line 150 cross over other circuit components which introduce additional capacitance on these lines.

To optimize the performance of the sensing circuit 114, a loading circuit 206 on the data bar line 152 is added to balance the load 204 on the data line 150. This is done to equalize timing and voltage swing on the data line 150 and the data line 152 so that performance of the cascode circuit 116 will be balanced. In accordance with the present embodiment, the loading circuit 206 is coupled with the cascode circuit 116 of the sensing circuit 114 and associated with the reference cell 118 to approximate the loading 204 associated with the selected memory cell 202. For use in the dual bank memory integrated circuit 100 of FIG. 1, the loading circuit 206 is shared for sensing memory cells of the first bank, lower bank 102 and memory cells of the second bank, upper bank 104.

Figure 3:
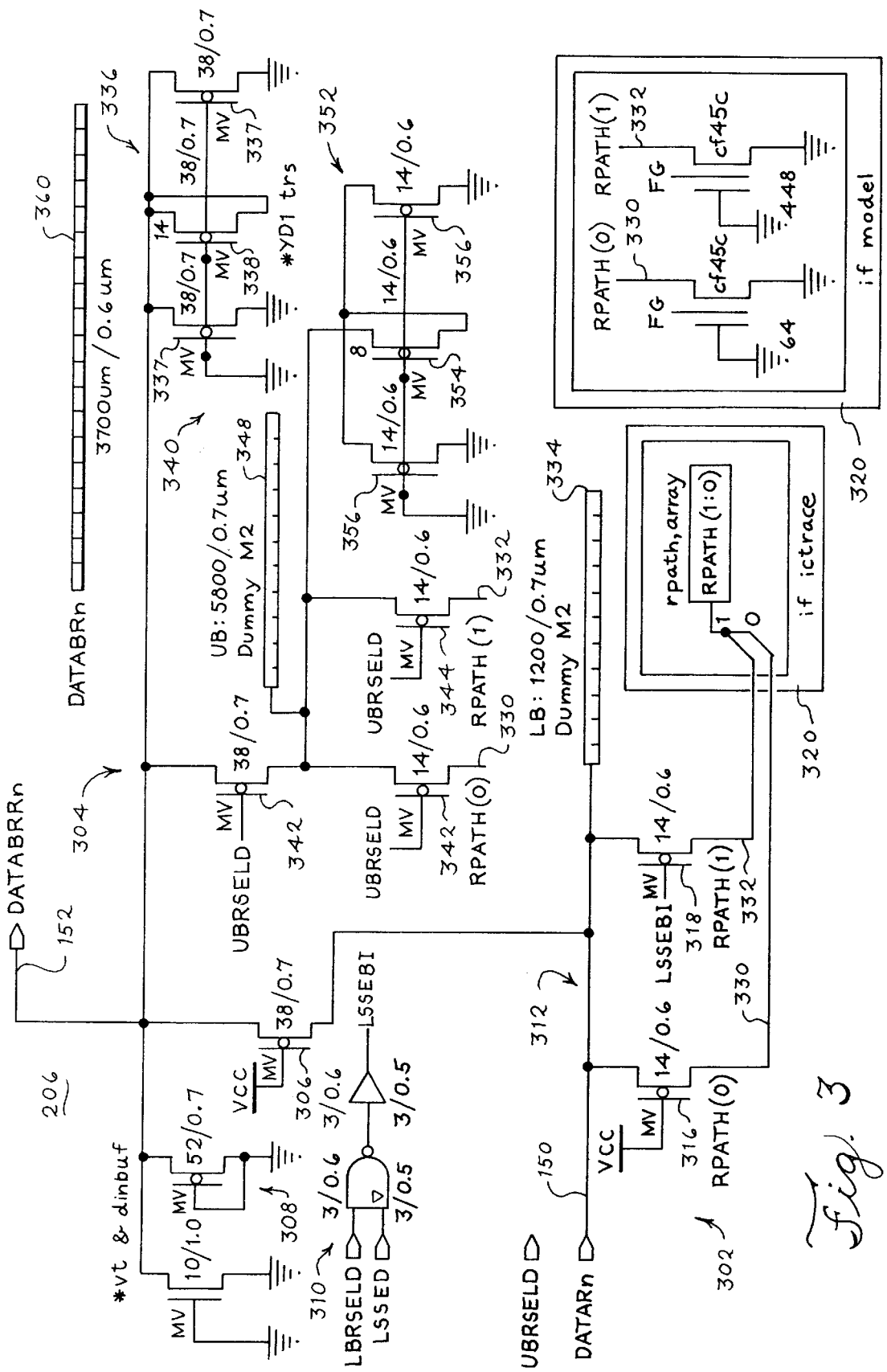
FIG. 3 is a circuit diagram, in partial block diagram form, of a loading circuit for use in the sensing circuitry of FIG.2.

FIG. 3 is a circuit diagram in partial block diagram form of a loading circuit 206 for use in the sensing circuitry 114 of FIG. 2. The loading circuit 206 illustrates transistors and dummy metal lines coupled to the data bar line 152 to approximate the loading associated with a selected memory cell.

The loading circuit 206 includes a first portion 302, a second portion 304 and Vt and data in buffer loading circuits 308. In accordance with the present invention, the first portion 302 of the loading circuit 306 is shared by both the lower bank 102 and the upper bank 104 of the memory integrated circuit 100 (FIG. 1). The second portion 304 is coupled to the data bar line 152 but is associated with only the upper bank 104. The loading circuit 206 further includes a pass transistor 306 coupled between the data bar line 152 and the first portion 302 of the loading circuit 206, and Vt and data in buffer loading circuits 308. The loading circuit 206 further includes logic circuitry 310 for generating a necessary logic signal in response to control signals of the integrated circuit 100.

The first portion 302 of the loading circuit includes a first plurality 312 of transistors coupled with the data bar line 152 to approximate the loading associated with a selected memory cell of the first or lower bank 102. The plurality 312 of transistors is coupled through the pass gate 306 to the data bar line 152. The plurality of transistors 312 includes a first read path transistor 316 and a second read path transistor 318. The first portion 302 of the loading circuit 206 further includes a read path array 320. The first read path transistor 316 has a drain coupled to the data line 150, a gate tied to Vcc, the positive supply voltage, and a source coupled to the read path array 320. The second read path transistor 318 has a drain coupled to the data line 150, a gate coupled to a signal LSSEBI, and a source coupled to the read path array 320.

The first and second read path transistors 316, 318 control matching of the loading on the data bar line 152 when either a small sector or a regular sector of the lower bank 102 is selected. This matching is controlled by the signal LSSEBI. This signal is generated in the logic circuit 310 by the logical combination of the signal LBRSELD, which corresponds to a lower bank read select signal, and the signal LSSEB, which corresponds to an active low lower bank small sector select signal. If a small sector of the lower bank 102 is selected, the signal LSSEB will be low. Accordingly, if a small sector of the lower bank 102 is selected, the signal LSSEBI will be low so that the second read path transistor 318 will be turned off. If a regular sector, rather than a small sector of the lower bank 102 is selected, the signal LSSEBI will be high, so that the second read path transistor 318 will be turned on. In this manner, the first and second read path transistors 316, 318 control the number of memory cell drains coupled to the data bar line 152 through the transistor 306. The read path transistors 316, 318 control coupling of the read path array 320 to the data bar line 152.

The read path array is illustrated in more detail in the inset of FIG. 3. The read path array 320 includes a total of 512 memory cells. This includes a total of 64 memory cells coupled to the first read path transistor 316 on a node 330 labeled RPATH(0) in FIG. 3. This further includes a total of 448 memory cells coupled to the second read path transistor 318 on a node 332 labeled RPATH(1). The read path array 320 is preferably a portion of the memory cell array located adjacent to the loading circuit 206 so that the core cell transistors of the read path array 320 match substantially identically the performance characteristics of the memory cells of the lower bank 102 and the upper bank 104. Since the illustrated embodiment is a flash memory, the read path array 320 includes flash memory cells. In alternative embodiments using other types of memory technology, other types of memory cells would be included in the read path array 320.

Since the gate of the first read path transistor 316 is tied to the positive supply voltage of Vcc, this transistor 316 is always turned on. Thus, this transistor 316 acts as a pass gate, coupling the 64 memory cells coupled to the node 332 to the data line 150 and through the pass transistor 306 to the data bar line 152. The second read path transistor is controlled by the signal LSSEBI. When a small sector is selected in the lower bank 102, this signal is low so that this transistor 318 is turned off. In this circumstance, only the 64 core cells coupled to the node 330 through the first read path transistor are coupled to the data bar line 152, to match the low associated with a small sector of the lower bank 102.

When the signal LSSEBI is high, the second read path transistor 318 is turned on, so that the additional 448 core cells coupled to the node 332 are also coupled through the second read path transistor 318 to the data bar line 152. Since the signal LSSEBI is controlled by the logic signals associated with lower bank read selection and lower bank small sector selection in the logic circuitry 10, the read path selection function is automatically controlled for matching the loading on the data bar line 152 and the data line 150.

The first portion 302 of the loading circuit 206 further includes a dummy metal line 334. This dummy metal line 334 is coupled to the drains of the first read path transistor 316 and the second read path transistor 318. As illustrated in FIG. 3, the dummy metal line 334 has a predetermined size. In the exemplary embodiment, this size is 1200 micrometers long and 0.7 micrometers wide. Preferably, this size matches the size of the bit lines in the lower bank 102 of the memory integrated circuit 100. By matching the size of the bit lines, the capacitive loading and other electrical characteristics associated with the bit lines are substantially matched in the loading circuit 206.

The second portion 304 of the loading circuit 206 includes a second plurality of transistors 340 which approximate loading associated with a selected memory cell of the second or upper bank 104. Further, the loading circuit 206 also includes a control transistor 342 which is coupled between the second plurality of transistors 340 and the data bar line 152. The control transistor couples the second plurality of transistors to the data bar line when the selected memory cell is in the second or upper bank.

The second plurality of transistors 340 includes a first read select transistor 342 and a second read select transistor 344. The first read select transistor 342 has a drain coupled to a node 346 and a gate coupled to a signal UBRSELD, which corresponds to an upper bank read select signal. The upper bank read select signal is high or logic 1 when a read operation is occurring in the upper bank 104. The source of the first read path transistor 342 is coupled to the read path array 320 through the node 330. The second read path transistor 334 has a drain coupled to the drain 346, a gate coupled to the signal UBRSELD and a source coupled to the read path array 320 through the node 332.

Unlike the read path transistors 316, 318 for the lower bank, the read path transistors 342, 344 associated with the upper bank read select signals switch only with the upper bank read select signal. There is no additional logic function associated with selection of a small sector because, in the illustrated embodiment, the upper bank 104 does not include small sectors. Thus, a total of 512 memory cells in the read path array 320 are always coupled with the node 346 when the upper bank read select signal UBRSELD is applied to the gates of the read path transistors 342,344.

The second portion 304 of the loading circuit 206 further includes a dummy metal line 348. As illustrated in FIG. 3, the dummy metal line 348 is associated with the upper bank 104 and preferably has dimensions matching the bit lines of the upper bank 104. In the illustrated embodiment, the dummy metal line 348 has a length of 5800 micrometers and a width of 0.7 micrometers.

The bit lines of the upper bank 104 are actually approximately 7,000 micrometers long. However, by sharing the loading circuitry 206, the 5,800 micrometer length of the dummy metal line 348 is combined with the 1,200 micrometer length of the dummy metal line 334 associated with the lower bank 102. In the aggregate, the two dummy metal lines 334, 348 provide loading to match the 7,000 micrometer loading associated with the bit line of the upper bank 104. That is, when the upper bank read select signal UBRSELD is asserted at the gate of the transistor 342, the dummy metal line 348 is coupled through the pass transistor 342 to the data bar line 152. The capacitance and other electrical parameters associated with the dummy metal line 348 are combined with the capacitance and associated electrical parameters associated with the dummy metal line 334, coupled to the data bar line 152 through the pass transistor 306.

Thus, the dummy metal line 334 is shared in the loading circuit 206 between the loading function for the upper bank 104 and the loading function for the lower bank 102. The benefit of this is reducing the dummy metal line length that must be provided to match the loading associated with the upper bank 104. This reduces the total area required for the circuitry of the loading circuit 206 and, in addition, reduces the manufacturing cost associated with manufacturing defects occurring in the dummy metal line 348.

The second portion 304 of the loading circuit 206 further includes a plurality of transistors 352. The plurality of transistors 352 preferably includes a total of 10 transistors to match loading associated with a total of eighteen Y decode transistors of the Y decode circuit 158. To reduce the total transistor count, a total of eight transistors 354 have both their respective sources and drains coupled to the node 346. Two additional transistors 356 have only a drain node coupled to the node 346. The gates of all sixteen transistors 354, 356 are tied to ground. By coupling both the drain and source of the transistors 354 to the node 346, the total number of transistors required to approximate the loading due to the Y decode transistors is reduced. This reduces the total area required as well as the likelihood of manufacturing defects.

The first portion 302 of the loading circuit 306 further includes a plurality 336 of transistors sized to approximate the loading due to the Y-decode circuit 156 associated with the lower bank 102. In the illustrated embodiment, the plurality 336 of transistors includes two transistors 337 each having a drain coupled to the data bar line 152 and a source and gate coupled to ground. The plurality 336 of transistors further includes a total of fourteen transistors 338 having a gate tied to ground with the source and drain both coupled to the data bar line 152. By tying both the drain and the source of the transistors 338 to the data bar line, the effect is to approximate the loading due to 28 transistors using only the fourteen transistors 338. In combination with the transistors 337, a total approximate loading of 32 transistors is provided using only 16 transistors. This provides the benefit of greatly reducing the area required for these devices as well as reducing the possibility of manufacturing defects due to the transistors which are omitted.

The loading circuit 206 further includes the Vt and data end buffer loading transistors 308. These transistors approximate the loading on the data bar line 152 associated with additional circuits of the memory innovative circuit 100. The loading due to these circuits is relatively small compared to the loading associated with the other circuits illustrated in FIG. 3.

From the foregoing, it can be seen that the present invention provides an improved method and apparatus which permit accurate matching of the loading on a reference memory cell of a duel bank memory chip. The loading associated with a first bank is shared between the first bank and the second bank when a read from the second bank occurs. Loading associated with the first bank is combined with additional loading associated with the second bank to properly match the loading of the reference cell to the loading experienced by the data line associated with the upper bank when a read to the first bank occurs. The additional loading associated with the second bank is de-coupled from the data bar line so that the total loading accurately matches the loading associated with the first bank only.

While a particular embodiment of the present invention has been shown and described, modifications may be made. For example, the loading due to metal capacitance may be approximated by adding transistors to the circuit in place of the dummy metal shown in the illustrated embodiment. It is therefore intended in the appended claims to cover all such changes and modifications which fall within the true spirit and scope of the invention.

What is claimed is:

1. A memory integrated circuit comprising:
    a first bank of memory cells;
    a second bank of memory cells;
    a sensing circuit coupled to the first and second banks of memory cells to determine a data state of a selected memory cell in relation to a reference cell; and
    a loading circuit coupled with the sensing circuit and associated with the reference cell to approximate loading associated with the selected memory cell, the loading circuit being shared for sensing memory cells of the first bank and memory cells of the second bank.

2. The memory integrated circuit of claim 1 further comprising:
    a first address decoding circuit associated with the first bank of memory cells; and
    a second address decoding circuit associated with the second bank of memory cells.

3. The memory integrated circuit of claim 2 further comprising
- a Y-decode circuit including a plurality of pass transistors having a source/drain coupled to the data bar line,
- the loading circuit including a plurality of loading transistors having a source and drain coupled to the data bar line to reduce the number of loading transistors.

4. The memory integrated circuit of claim 2 wherein the loading circuit comprises:
- a first plurality of transistors coupled with a data bar line to approximate loading associated with a selected memory cell of the first bank;
- a second plurality of transistors to approximate loading associated with a selected memory cell of the second bank; and
- a control transistor coupled between the second plurality of transistors and the data bar line, the control transistor coupling the second plurality of transistors to the data bar line when the selected memory cell is in the second bank.

5. The memory integrated circuit of claim 4 wherein the loading circuit further comprises:
- a first dummy metal line to approximate bit line loading associated with a selected memory cell of the first bank; and
- a second dummy metal line coupled with the control transistor to approximate bit line loading associated with a selected memory cell of the second bank.

6. The memory integrated circuit of claim 5 wherein the loading circuit further comprises:
- a first dummy array of memory cells;
- a second dummy array of memory cells; and
- a second control transistor coupled between the data bar line and the second dummy array of memory cells selectively couple the second dummy array to the data bar line.

7. The memory integrated circuit of claim 6 wherein the first dummy array of memory cells comprises a number of memory cells matching a number of memory cells of a bit line of the first bank and the second dummy array of memory cells comprises a number of memory cells matching a number of memory cells of a bit line of the second bank.

8. A method for operating a dual bank memory integrated circuit, the method comprising steps of:
- selecting a selected memory cell to be read from one of a first bank and a second bank of the memory integrated circuit;
- sensing a data signal of the selected memory cell on a data line;
- comparing the data signal with a reference signal on data bar line;
- matching loading on the data bar line to loading on the data line by sharing a loading circuit for selected memory cells from both the first bank and the second bank.

9. The method of claim 8 further comprising steps of:
- loading the data bar line with a plurality of pass transistors matching transistors of a Y decode circuit of the dual bank memory integrated circuit.

10. The method of claim 9 wherein loading the data bar line comprises steps of:
- coupling a source and a drain of a second plurality of the pass transistors to the data bar line to reduce the number of pass transistors required for loading the data bar line.

11. The method of claim 8 wherein matching loading comprises steps of:
- adding first loading circuitry to the data bar line when the selected memory cell is to be read from the first bank, and
- adding the first loading circuitry and second loading circuitry to the data bar line when the selected memory cell is to be read from the second bank.

12. The method of claim 11 wherein adding the first loading circuitry and second loading circuitry comprises steps of:
- switching the second loading circuitry into electrical connection with the data bar line when the selected memory cell is from the second bank.

13. The method of claim 12 wherein adding the first loading circuitry and second loading circuitry comprises steps of:
- adding to the data bar line first loading circuitry having parasitic resistance and capacitance to match parasitic resistance and capacitance associated with the first bank; and
- when the selected memory cell is from the second bank, adding to the data bar line additional parasitic resistance and capacitance matching the difference between the parasitic resistance and capacitance associated with the first bank and the parasitic resistance and capacitance associated with the second bank.

14. A memory comprising:
- a first bank of memory cells;
- a second bank of memory cells;
- a reference circuit;
- a sense amplifier coupled to the first and second banks of memory cells and the reference circuit; and
- a shared load circuit which matches electrical loading on the reference circuit with loading on a selected memory cell selected from one of the first bank and the second bank; and
- a second bank load circuit which matches electrical loading on the reference circuit with loading on a selected memory cell selected from the second bank.

* * * * *